United States Patent
Kokubo et al.

(10) Patent No.: US 8,318,074 B2
(45) Date of Patent: Nov. 27, 2012

(54) TRANSFER APPARATUS HAVING GIMBAL MECHANISM AND TRANSFER METHOD USING THE TRANSFER APPARATUS

(75) Inventors: Mitsunori Kokubo, Numazu (JP);
Yukio Iimura, Suntou-gun (JP);
Masakazu Kanemoto, Gotenba (JP);
Kentaro Ishibashi, Numazu (JP)

(73) Assignee: Toshiba Kikai Kabushiki Kaisha, Tokyo (JP)

( * ) Notice: Subject to any disclaimer, the term of this patent is extended or adjusted under 35 U.S.C. 154(b) by 174 days.

(21) Appl. No.: 12/633,183

(22) Filed: Dec. 8, 2009

(65) Prior Publication Data

US 2010/0086629 A1    Apr. 8, 2010

Related U.S. Application Data

(62) Division of application No. 11/403,984, filed on Apr. 14, 2006, now Pat. No. 7,648,354.

(30) Foreign Application Priority Data

Apr. 28, 2005  (JP) ................. 2005-132974
May 25, 2005  (JP) ................. 2005-152738
May 25, 2005  (JP) ................. 2005-152975

(51) Int. Cl.
*B28B 3/00*   (2006.01)
(52) U.S. Cl. .................................... 264/319
(58) Field of Classification Search .............. 264/319
See application file for complete search history.

(56) References Cited

U.S. PATENT DOCUMENTS

| 3,828,842 | A  | 8/1974  | Tagnon |
| 4,316,712 | A  | 2/1982  | Medendorp |
| 4,878,826 | A  | 11/1989 | Wendt |
| 4,907,956 | A  | 3/1990  | Ezaki et al. |
| 4,969,812 | A  | 11/1990 | Brown |
| 5,496,433 | A  | 3/1996  | Miyashita et al. |
| 6,364,648 | B1 | 4/2002  | Bishop et al. |
| 6,416,311 | B1 | 7/2002  | Springer et al. |
| 6,471,501 | B1 | 10/2002 | Shinma et al. |
| 6,699,425 | B1 | 3/2004  | Reuther et al. |
| 6,808,443 | B2 | 10/2004 | Halley |
| 7,070,405 | B2 | 7/2006  | Sreenivasan et al. |
| 7,108,812 | B2 | 9/2006  | Hosoe |
| 7,140,861 | B2 | 11/2006 | Watts et al. |

(Continued)

FOREIGN PATENT DOCUMENTS

DE    10 2006 018 139 A1    3/2007

(Continued)

OTHER PUBLICATIONS

Stephen Y. Chou et al., "Nanoimprint Lithography", J. Vac. Sci. Technol. B, vol. 14, No. 6, pp. 4129-4133 (1996).

(Continued)

*Primary Examiner* — Larry Thrower
(74) *Attorney, Agent, or Firm* — DLA Piper LLP (US)

(57) ABSTRACT

A transfer apparatus includes a table on which a molding material is placed, a mold holding body that fixes and holds a mold disposed such as to be opposed to a surface of the table, a gimbal member which holds the mold holding body and which forms a convex spherical surface portion, a gimbal member formed with a concave spherical surface portion which is opposed and in contact with the convex spherical surface portion, a movable body that holds the gimbal member and which can advance and retreat in the vertical direction with respect to the table surface, and an attitude adjusting/holding unit that adjusts and holds attitude of the gimbal member.

3 Claims, 7 Drawing Sheets

U.S. PATENT DOCUMENTS

| | | | |
|---|---|---|---|
| 7,150,622 | B2 | 12/2006 | Choi et al. |
| 7,204,686 | B2 | 4/2007 | Chung et al. |
| 7,448,862 | B2 | 11/2008 | Kokubo et al. |
| 7,448,865 | B2 | 11/2008 | Kokubo et al. |
| 7,465,162 | B2 | 12/2008 | Kokubo et al. |
| 2004/0200368 | A1 | 10/2004 | Ogino et al. |
| 2005/0089597 | A1 | 4/2005 | Ito |
| 2006/0037406 | A1 | 2/2006 | Dharia |
| 2006/0193938 | A1 | 8/2006 | Iimura et al. |
| 2006/0233906 | A1 | 10/2006 | Kokubo et al. |
| 2006/0257514 | A1 | 11/2006 | Kobuko et al. |

FOREIGN PATENT DOCUMENTS

| | | |
|---|---|---|
| JP | 63-261405 | 10/1988 |
| JP | 04-319414 | 11/1992 |
| JP | 08-259245 | 10/1996 |
| JP | 2001-135634 | 5/2001 |
| JP | 2004-034300 | 2/2004 |
| JP | 2004-103232 | 4/2004 |
| JP | 2004-288784 | 10/2004 |
| JP | 2004-291607 | 10/2004 |
| JP | 2004-358857 | 12/2004 |
| JP | 2005-052841 | 3/2005 |
| JP | 2005-101201 | 4/2005 |
| JP | 2007-296530 | 11/2007 |
| WO | WO 2004/093171 | 10/2004 |

OTHER PUBLICATIONS

Office Action in U.S. Appl. No. 11/415,130 mailed Feb. 4, 2008.
Office Action in U.S. Appl. No. 11/404,799 mailed Feb. 6, 2008.
German Office Action issued on Aug. 3, 2007, in related Application No. 10 2006 021 507.9.
English translation of German Office Action issued on Aug. 3, 2007, in related Application No. 10 2006 021 507.9.
Non-Final Office Action; U.S. Appl. No. 11/439,291 mailed Jan. 10, 2008.
English Translation of Taiwanese IPO Search Report issued in Application No. 095114106 mailed Jan. 31, 2008.
Taiwanese IPO Search Report issued in Application No. 095114106 mailed Jan. 31, 2008.
B.J. Choi et al., "Design of orientation stages for step and flash imprint lithography", Precision Engineering Journal of the International Societies for Precision Engineering and Nanotechnology, 25 (2001) pp. 192-199.
English language abstract of TW 368465.
English language abstract of TW 476700, published Feb. 21, 2002.
English language abstract of TW 458882, published Oct. 11, 2001.
English language abstract of TW 200413159.
English language abstract of JP 2004-034300, published Feb. 5, 2004.
Notice of Allowance issued in U.S. Appl. No. 11/404,799 mailed Jul. 9, 2008.
Office Action issued on Jan. 19, 2007, in Korean Application No. 10-2006-34744.
English translation of Korean Office Action (KR Appl. No. 10-2006-34744).
Machine translation of JP Publication No. 2004-034300.
English Abstract of JP Publication No. 2004-288784 published on Oct. 14, 2004.
Machine translation of JP Publication No. 2004-288784.
English Abstract of JP Publication No. 2004-358857 published on Dec. 24, 2004.
Machine translation of JP Publication No. 2004-358857.
Notice of Allowance issued in U.S. Appl. No. 11/439,291 mailed Jul. 30, 2008.
Notice of Allowance issued in U.S. Appl. No. 11/415,130 mailed Aug. 12, 2008.
Office Action issued in U.S. Appl. No. 11/403,984 mailed Apr. 6, 2009.
Notice of Allowance issued on Sep. 8, 2009 in U.S. Appl. No. 11/403,984.
Japanese Office Action issued in JP 2005-132974 issued Jan. 25, 2011.
English Translation of Japanese Office Action issued in JP 2005-132974 issued Jan. 25, 2011.
English Language Abstract of JP 2005-052841 published Mar. 3, 2005.
English Language Translation of JP 2005-052841 published Mar. 3, 2005.
English Language Abstract of JP 2004-291607 published Oct. 21, 2004.
English Language Translation of JP 2004-291607 published Oct. 21, 2004.
English Language Abstract of JP 2007-296530 published Nov. 15, 2007.
English Language Translation of JP 2007-296530 published Nov. 15, 2007.
English Language Abstract of JP 04-319414 published Nov. 10, 1992.
English Language Abstract of JP 63-261405 published Oct. 28, 1988.
English Language Abstract of JP 2001-135634 published May 18, 2001.
English Language Translation of JP 2001-135634 published May 18, 2001.
English Language Abstract of JP 2004-103232 published Apr. 2, 2004.
English Language Translation of JP 2004-103232 published Apr. 2, 2004.
English Language Abstract of JP 2005-101201 published Apr. 14, 2005.
English Language Translation of JP 2005-101201 published Apr. 14, 2005.
English Language Abstract of JP 08-259245 published Oct. 8, 1996.
English Language Translation of JP 08-259245 published Oct. 8, 1996.

LOCUS OF CENTER OF UPPER SURFACE OF GIMBAL

PROJECTION OF UNIT VECTOR n OF NORMAL OF GIMBAL UPPER SURFACE ON X-Y PLANE

TRANSFER APPARATUS HAVING GIMBAL MECHANISM AND TRANSFER METHOD USING THE TRANSFER APPARATUS

CROSS-REFERENCE TO RELATED APPLICATIONS

This application is a divisional of U.S. application Ser. No. 11/403,984 filed Apr. 14, 2006. U.S. application Ser. No. 11/403,984 claims the benefit of priority from prior Japanese Patent Applications No. 2005-132974 filed Apr. 28, 2005, Japanese Patent Application No. 2005-152738 filed May 25, 2005, and Japanese Patent Application No. 2005-152975 filed May 25, 2005. The entirety of each of the above-listed Applications are incorporated herein by reference.

BACKGROUND OF THE INVENTION

1. Field of the Invention

The present invention relates to a transfer apparatus that transfers a fine concavo-convex pattern formed on a surface of a mold to a surface of a workpiece using a lithography technique, and more particularly, to a transfer apparatus capable of reducing positional deviation (lateral deviation) between the mold and the workpiece.

2. Description of Related Art

In recent years, nanoimprint techniques have been researched and developed. According to the nanoimprint techniques, a quartz substrate is formed with a super-fine pattern by an electron drawing method or the like to form a mold (template, stamper), the mold is pressed against a resist film formed on a substrate surface as a workpiece under a predetermined pressure, thereby transferring the pattern formed on the mold (see non-patent document 1: Precision Engineering Journal of the International Societies for Precision Engineering and Nanotechnology).

When super-fine concavo-convex pattern formed on a mold such as a template and a stamper using the lithography technique is pressed against and transferred to a workpiece, it is necessary to precisely and finely adjust attitude of the mold with respect to a surface of the workpiece so that a transfer surface of the mold on which the pattern is formed and a surface of the workpiece come into intimate contact with each other equally and the fine concavo-convex pattern formed on the workpiece is precisely transferred to the workpiece.

To finely adjust the mold, the non-patent document 1 discloses a configuration in which a holding member for holding the mold is made of a flexible material, and when a transfer surface of the mold is pressed against the surface of the workpiece, the holding member of the mold is allowed to follow the surface of the workpiece along the surface of the workpiece.

When the attitude of the mold is finely adjusted such as to follow the surface of the workpiece, if the mold is pressed against the surface of the workpiece, it is necessary to press the mold under a pressure as small as possible so that the workpiece is not damaged, and the holding member of the mold is made based on a small pressure for controlling the attitude.

Therefore, in order to transfer the pattern formed on the transfer surface of the mold to the surface of the workpiece after the attitude of the mold with respect to the surface of the workpiece is finely adjusted, it is necessary to apply a large pressure. When the holding member of the mold is configured to cope with the attitude controlling small pressure, however, there is a problem that a large pressure required for transferring the pattern cannot be applied. There are various materials for workpieces depending upon use, and it is necessary to variously change the transfer the pressure when the pattern formed on the mold is to be transferred to the workpiece.

In the case of the transfer apparatus of this kind, it is necessary to strictly keep the parallelism of mutually contact surfaces of the mold and the workpiece, and to suppress the positional deviation (lateral deviation) in a direction perpendicular to the mutually pressing direction of the mold and the workpiece when the mold is pressed and released.

For this purpose, an apparatus described in Japanese Patent Application Laid-open No. 2004-34300 (patent document 1) is proposed. According to this apparatus, a lower horizontal portion of an L-shaped frame is provided with an X-Y stage, a workpiece supporting member is mounted on the stage, and an upper portion of a vertical portion of the frame is provided with a mold support portion through a vertical moving mechanism.

The workpiece support portion includes a support member (a workpiece support member) and a magnetic material provided thereon. A workpiece is set on the magnetic material. The support portion includes a support member which is vertically moved by a moving mechanism, and a magnet mounted on a lower surface of the support member through an elastic member. A mold is set on a lower surface of the magnet.

According to the conventional apparatus, deviation of parallelism is absorbed through the elastic member, and when the mold and the workpiece are pressed against each other, magnetic attraction force is applied between the support member which supports the mold and a support member which supports the workpiece by the magnet and the magnetic material, thereby preventing relative movement in a direction perpendicular to the pressing direction, i.e., the positional deviation (lateral deviation).

According to the apparatus disclosed in the patent document 1, when the mold is pressed against the workpiece by the magnetic attraction force caused by the magnet and the magnetic material, it is possible to suppress the positional deviation (lateral deviation), but if the mold is strongly pressed by the moving mechanism in addition to the magnetic attraction force, an upper portion of the vertical portion of the frame is warped leftward by the reaction force, and the positional deviation (lateral deviation) is generated. When the frame is deformed by temperature variation also, there is a problem that the positional deviation (lateral deviation) is generated.

When a mold is released from a workpiece, if ultrasound vibration is applied, it becomes easy to release the mold from the workpiece. However, when the amplitude of the ultrasound vibration is greater than the fine concavo-convex shape, it becomes easy to release the mold but there is a problem that the fine concavo-convex shape can be damaged and it is not always preferable to apply the ultrasound vibration.

SUMMARY OF THE INVENTION

It is an object of the present invention to provide a transfer apparatus and a transfer method in which the above problems are solved, a gimbal mechanism is employed instead of a flexible material for holding a mold to simplify the structure, and the positional deviation (lateral deviation) caused by pressing force or temperature variation can be suppressed to a small level, and even when the concavo-convex shape is fine, the mold can easily be released without damaging the concavo-convex shape.

The present invention has been achieved in view of the above problem, and a first aspect of the present invention provides a transfer apparatus having a gimbal mechanism, including: a table on which a molding substrate is placed and to which a molding material is supplied, a mold holding body that fixes and holds a transfer mold disposed such as to be opposed to the table surface to and on a lower surface thereof, a first gimbal member which holds the mold holding body on one surface of the first gimbal member and which forms a convex spherical surface portion on the other surface of the first gimbal member, a second gimbal member formed with a concave spherical surface portion which is opposed to and in contact with a convex spherical surface portion of the first gimbal member, a movable body that holds the second gimbal member and which can advance and retreat in a vertical direction with respect to the table surface, a movable body drive unit including a servomotor for advancing and retreating the movable body in the vertical direction, and an attitude adjusting/holding unit that adjusts and holds attitude of the first gimbal member.

According to a second aspect of the present invention, in a transfer method for performing a transfer operation using the transfer apparatus, attitude of a first gimbal member of the gimbal mechanism is held during a lowering motion of the movable body and until a mold is lowered to a predetermined lowering position immediately before the mold comes into contact with a substrate, and when the movable body reaches the predetermined lowering position, the attitude of the first gimbal member is brought into a free state, and speed of the first gimbal member is reduced, and a molding operation with respect to a molding material is performed.

A third aspect of the present invention provides a transfer apparatus including: a base frame provided on a one end of a base frame, a support frame provided on the other end of the base frame such as to be opposed to the base frame, a plurality of tie bars which integrally connect the base frame and the support frame, a movable body that is disposed between guide frames provided on left and right sides of the base frame and which can move along the tie bars between the base frame and the support frame, a guide unit provided on the guide frames on the opposite sides such that the guide unit guides in a moving direction along the tie bars to symmetric positions with respect to the center of the movable body, and a drive unit that is mounted on the support frame for moving the movable body along the guide unit, wherein one of the base frame and the movable body is provided, through a gimbal mechanism, with a mold holding body that holds a transfer mold or a support stage which supports a workpiece which is transferred by the mold, the other one of the base frame and the movable body includes a support stage which is opposed to the mold holding body mounted on the gimbal mechanism or a support stage mounted on the gimbal mechanism.

According to this invention, the gimbal mechanism having the first gimbal member and the second gimbal member is employed, and the suction with respect to the first gimbal member is adjusted. With this configuration, it is possible to easily adjust and hold the attitude of the mold mounted on the first gimbal member.

The movable body is supported by the guide unit at substrate the central positions of both the side surfaces. Therefore, even if the frame is deformed by the temperature variation, it is possible to further reduce the positional deviation (lateral deviation) of the movable body. Thus, the positional deviation (lateral deviation) between the mold and the workpiece with respect to the pressing force and the temperature variation can be suppressed to small level.

A fourth aspect of the present invention provides a transfer apparatus having a gimbal mechanism, including: a table on which a molding material is placed, a mold holding body that fixes and holds a transfer mold disposed such as to be opposed to the table surface, a first gimbal member which holds the mold holding body on one surface of the first gimbal member and which forms a convex spherical surface portion on the other surface of the first gimbal member, a second gimbal member-formed with a concave spherical surface portion which is opposed to and in contact with a convex spherical surface portion of the first gimbal member, a movable body that holds the second gimbal member and which can advance and retreat in a vertical direction with respect to the table surface, a movable body drive unit including a servomotor for advancing and retreating the movable body in the vertical direction, and an attitude adjusting/holding unit that adjusts and holds attitude of the first gimbal member, wherein the attitude adjusting unit includes at least three piezo-hammers each including a piezo-element, two inertial bodies having different inertia amounts, and a fluid pressure cylinder in combination, the piezo-hammers are disposed on a circumference between the first and the second gimbal members at equal distances from one another.

A fifth aspect of the present invention provides a transfer method for performing a fine transfer operation using the transfer apparatus, attitude of a first gimbal member of the gimbal mechanism is held during a lowering motion of the movable body and until a mold is lowered to a predetermined lowering position immediately before the mold comes into contact with a substrate, and when the movable body reaches the predetermined lowering position, the attitude of the first gimbal member is brought into a free state, and speed of the first gimbal member is reduced, and a molding operation with respect to a molding material is performed.

According to this invention, the movable body is supported by the guide unit at substrate the central positions of both the side surfaces. Therefore, even if the frame is deformed by the temperature variation, it is possible to further reduce the positional deviation (lateral deviation) of the movable body. Thus, the positional deviation (lateral deviation) between the mold and the workpiece with respect to the pressing force and the temperature variation can be suppressed to small level.

The first gimbal member on which the mold holding body is mounted can adjust the attitude of the first gimbal member by the piezo-hammer very precisely, and the adjusting range can be remarkably increased by the fluid pressure cylinder as compared with a transfer apparatus including only a piezo-element.

Furthermore, it is possible to provide vibration having considerably small amplitude by vibration caused by the piezo-hammer during the mold-releasing operation. Thus, it is possible to easily release a workpiece having fine concavo-convex pattern from a mold without damaging the mold.

A sixth aspect of the present invention provides a transfer apparatus having a gimbal mechanism, including: a table on which a molding material is placed, a mold holding body that fixes and holds a transfer mold disposed such as to be opposed to the table surface, a first gimbal member which holds the mold holding body on one surface of the first gimbal member and which forms a convex spherical surface portion on the other surface of the first gimbal member, a second gimbal member formed with a concave spherical surface portion which is opposed to and in contact with a convex spherical surface portion of the first gimbal member, a movable body that holds the second gimbal member and which can advance and retreat in a vertical direction with respect to the table surface, a movable body drive unit including a servomotor for advancing and retreating the movable body in the vertical direction, and an attitude adjusting/holding unit that adjusts and holds attitude of the first gimbal member, wherein the attitude adjusting/holding unit includes at least three piezo-actuators formed by laminating piezo-elements, the piezo-actuators are disposed between the first gimbal member and the second gimbal member.

A seventh aspect of the present invention provides a transfer method for performing a fine transfer operation using the transfer apparatus, attitude of a first gimbal member of the gimbal mechanism is held during a lowering motion of the movable body and until a mold is lowered to a predetermined lowering position immediately before the mold comes into contact with a substrate, and when the movable body reaches the predetermined lowering position, the attitude of the first gimbal member is brought into a free state, and speed of the first gimbal member is reduced, and a molding operation with respect to a molding material is performed.

According to this invention, the movable body is supported by the guide unit at substrate the central positions of both the side surfaces. Therefore, even if the frame is deformed by the temperature variation, it is possible to further reduce the positional deviation (lateral deviation) of the movable body. Thus, the positional deviation (lateral deviation) between the mold and the workpiece with respect to the pressing force and the temperature variation can be suppressed to small level.

The first gimbal member on which the mold holding body is mounted can adjust the attitude of the first gimbal member by the piezo-actuator very precisely, and can hold the attitude. Furthermore, the first gimbal member can read a command value with respect to the piezo-actuator and can reproduce the attitude any time.

Furthermore, it is possible to provide vibration having considerably small amplitude by vibration caused by the piezo-hammer during the mold-releasing operation. Thus, it is possible to easily release a workpiece having fine concavo-convex pattern from a mold without damaging, the mold.

DETAILED DESCRIPTION OF THE INVENTION

Figure 1:
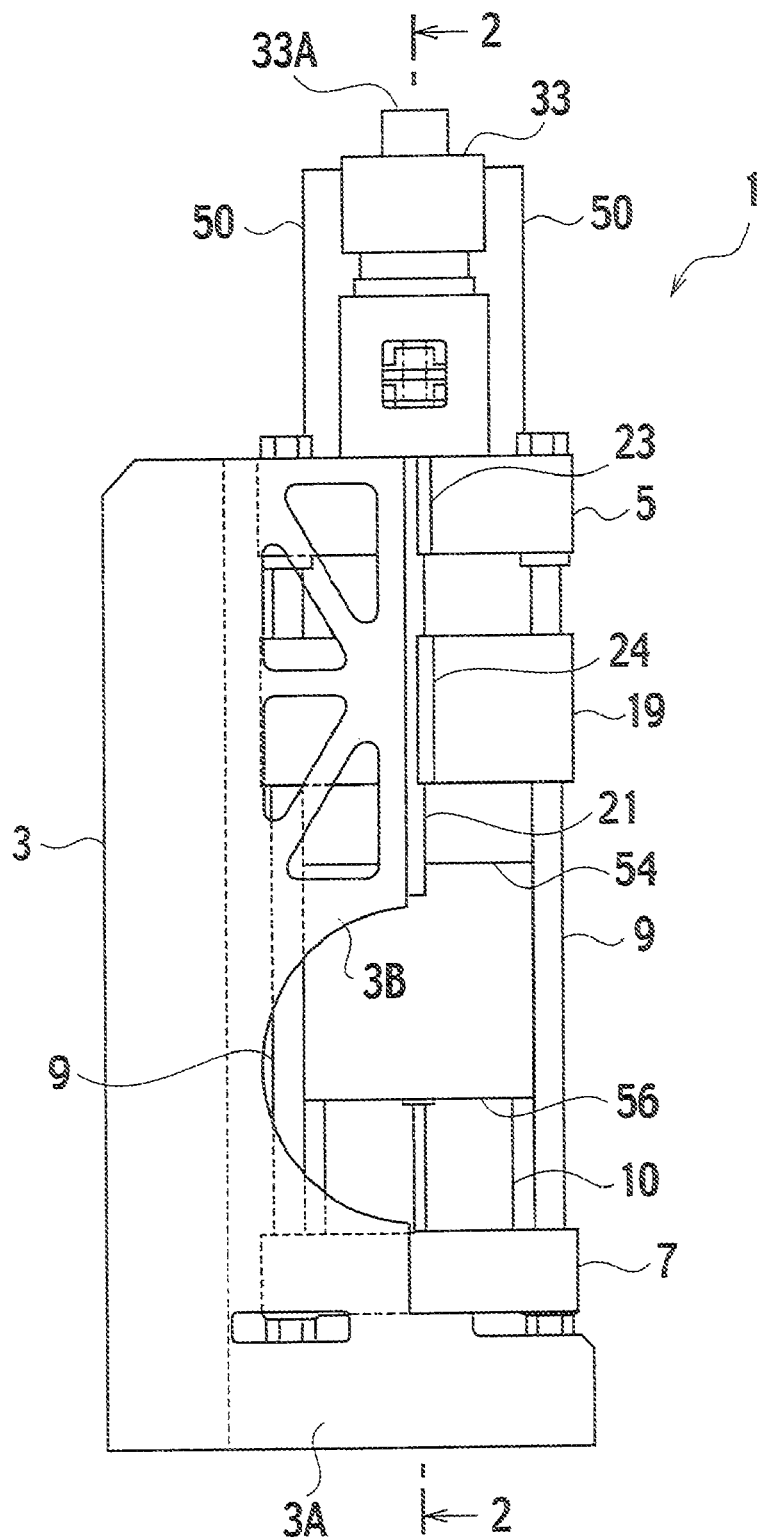
FIG. 1 is a left side view showing a transfer apparatus according an embodiment of the present invention.
Figure 2:
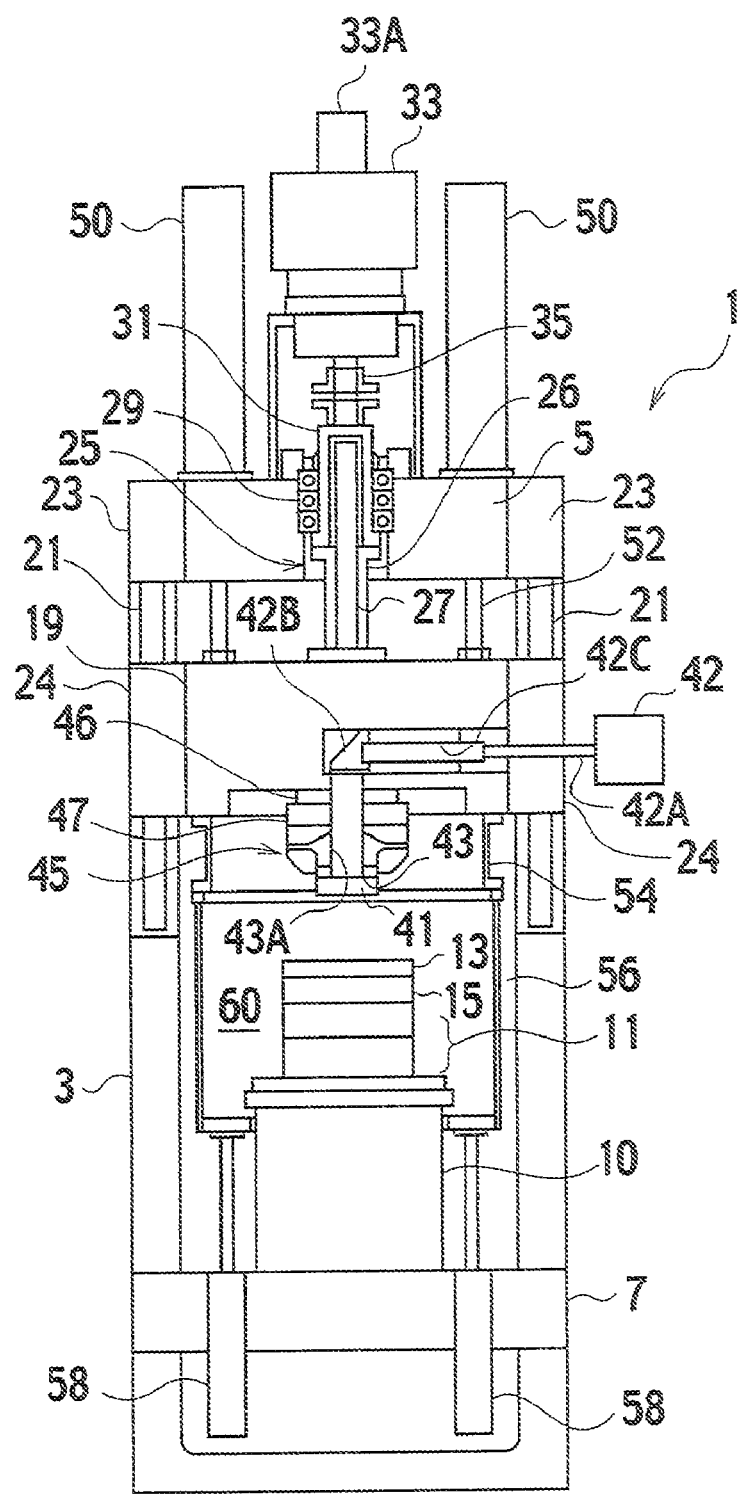
FIG. 2 is a cross sectional view taken along a line 2-2 in FIG. 1.
Figure 3:
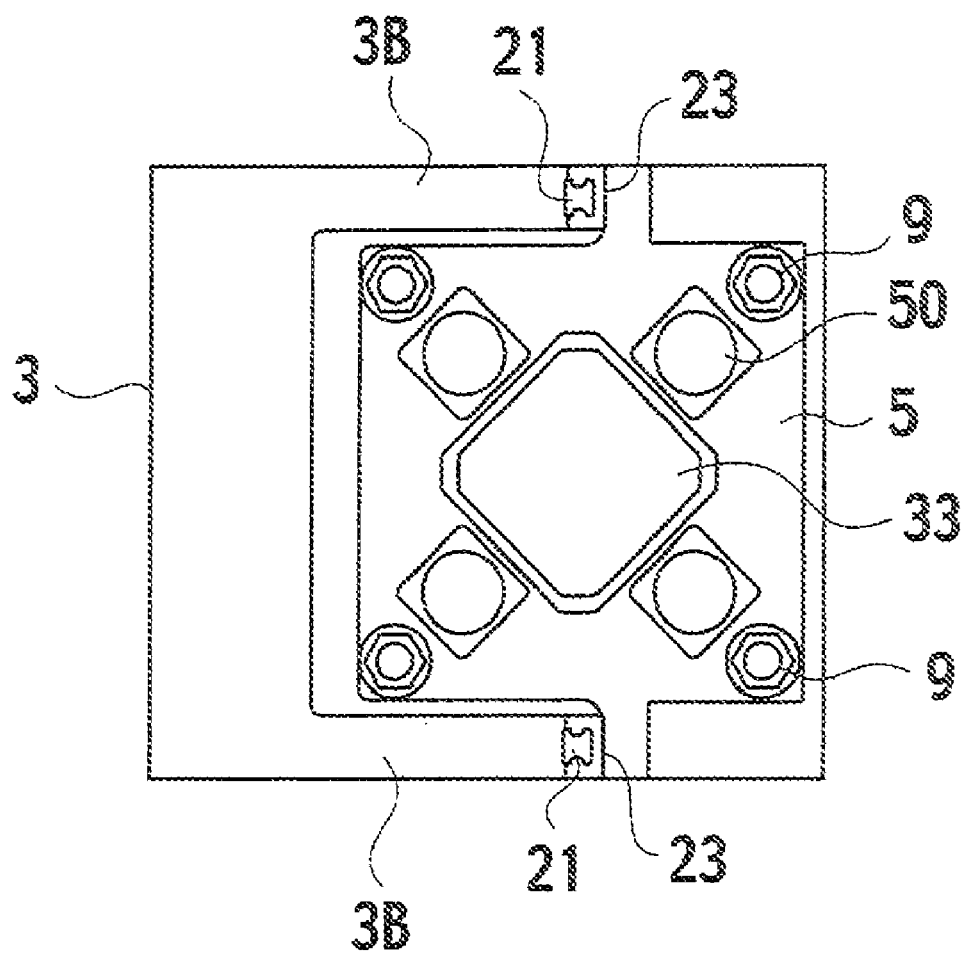
FIG. 3 is a plan view of FIG. 1.

FIGS. 1 to 3 show an example of the entire structure of a transfer apparatus according to an embodiment of the present invention. In FIGS. 1 and 2, a reference symbol 1 represents a transfer apparatus, and a reference symbol 3 represents a body frame. The body frame 3 is of an L-shape as viewed from side as shown in FIG. 1. A square lower frame 7 as a base frame is integrally mounted on a lower portion of the body frame 3. Tie bars 9 stand from four corners of the lower frame 7 in parallel to a vertical portion of the body frame 3. A square upper frame 5 as a support frame for supporting a drive unit is mounted on upper ends of the tie bars 9. A square movable body 19 is movably loosely fitted over the tie bars 9 between the upper frame 5 and the lower frame 7 such that the movable body 19 can vertically move along the tie bars 9.

An upper portion of the body frame 3 projects forward (rightward in FIG. 1) such as to reach a half (intermediate) position in the longitudinal direction on both left and right side surfaces of the upper frame 5 and the movable body 19, and a vertically extending linear guide (a guide unit) 21 is mounted on a tip end of the upper portion of the body frame 3. Sliders 23 and 24 are mounted on both left and right side surfaces of the upper frame 5 and the movable body 19. The sliders 23 and 24 are engaged with the linear guide 21 and precisely guided and moved vertically in a zero clearance state for example.

As can be understood from the above explanation, the body frame 3 is provided at its one end (lower end) with a frame support portion 3A which supports the lower frame (base frame) 7. With this configuration, the body frame 3 is of the L-shape as viewed from side as shown in FIG. 1. Guide frames 3B having the linear guide 21 forwardly projects from both left and right sides (both sides in a direction perpendicular to the paper sheet of FIG. 1) of the other end (upper end) of the body frame 3. With this configuration, a recess is formed in the upper end (other end) of the body frame 3.

As shown in FIG. 3, the upper frame 5 and the movable body 19 are disposed between the left and right guide frames 3B of the body frame 3. The sliders 23 and 24 provided on the upper frame 5 and the movable body 19 are movably engaged with the linear guide 21 at symmetric locations with respect the centers in the longitudinal direction (the lateral direction in FIGS. 1 and 3) and the lateral direction (the direction perpendicular to the paper sheet of FIG. 1 and the vertical direction in FIG. 3). Although the linear guide 21 is commonly used for the sliders 23 and 24 in FIG. 1, it is also possible to provide linear guides for the sliders 23 and 24, respectively. However, if the machining precision of parallelism of the sliders, it is preferable that the linear guide 21 is commonly used for the sliders 23 and 24.

The upper frame 5 is fixed to the lower frame 7 and the body frame 3 through the tie bars 9, but when the tie bars 9 are extended or contracted due to later-described pressing force of the mold or temperature variation, in order to permit the vertical motion of the upper frame 5 and to prevent the positional deviation (lateral deviation) of the upper frame 5 on a plane perpendicular to the tie bar 9 generated by the bending or expansion and contract of the tie bar 9, the linear guide 21 and the slider 23 are provided. They prevent the positional deviation (lateral deviation) of the upper frame 5 more reliably. The upper frame 5 can be separated from the body frame 3 and can be connected and fixed to the lower frame 7 by the tie bar 9.

The movable body 19 is loosely fitted over the tie bars 9, the movement of the movable body 19 is precisely guided in the vertical direction (the direction perpendicular to the surface of a table 11) by the linear guide 21 and the slider 24.

The linear guide 21 and the sliders 23 and 24 prevents the positional deviation (lateral deviation) caused by the temperature variation of the upper frame 5 and the movable body 19. Therefore, it is preferable that the linear guide 21 and the sliders 23 and 24 are disposed at symmetric positions with respect to the center in the longitudinal direction and the lateral direction of the upper frame 5 and the movable body 19.

A stationary stage 10 vertically extending upward is mounted on a central portion of an upper surface of the lower frame 7. As shown in FIG. 2, the movable table 11 is provided on the stationary stage 10 such that the movable table 11 can move in an X direction and a Y direction (a longitudinal direction and a lateral direction) and the movable table 11 can finely be adjusted and positioned. A support stage 15 which supports the workpiece 13 is provided on the movable table 11. The movable table 11 is guided by the linear guide and the slider, and is driven by a servomotor. The movable table 11 is of a known structure and thus, detailed explanations thereof will be omitted.

The workpiece 13 includes a substrate made of an appropriate material such as silicon, glass and ceramic, and a thin film formed thereon. The thin film is made of a layer (not shown) made of ultraviolet cure resin by a few tens nm to a few tens μm thickness. A resist made of thermoplastic resin is used as the layer in some cases. Therefore, a heating unit (not shown) such as a heater can be incorporated in the support stage 15 for heating and softening the layer to facilitate the molding operation.

As shown FIG. 2, a turn table 47 is mounted on a central portion (central portion of a surface opposed to the base frame) of a lower surface of the movable body 19 through a load cell 46 such that the turn table 47 can turn around a central portion of the lower surface of the movable body 19 and can be fixed to a predetermined angle position. A mold support plate 43 as a mold holding body is mounted on the turn table 47 through a gimbal mechanism 45. A mold 41 is detachably mounted on the mold support plate 43.

The gimbal mechanism 45 includes a spherical surface formed around a mold surface (lower surface in FIG. 2) of the mold 41. Although it is not shown in the drawing in detail, the spherical surface is supported by an air bearing, the mold 41 can be tilted around the central portion of the mold surface, the air bearing is brought into a negative pressure, and the mold 41 can be fixed immovably.

The mold 41 is formed with fine concavo-convex pattern using on the mold surface (lower surface in FIG. 2) using the lithography technique, and in this embodiment, the mold surface is a clear quartz glass through which ultraviolet rays easily passes.

Each of the mold support plate 43, the gimbal mechanism 45, the turn table 47 and the load cell 46 is formed at its center with a through hole 43A. The movable body 19 is provided with a through hole 42C through which ultraviolet rays are introduced to a back surface of the mold 41 from an ultraviolet rays source 42 (UV generator) through an optical fiber 42A and a reflection mirror 42B. That is, a light introducing path is provided. The UV generator 42 is held by the movable body 19 on the side of the movable body 19.

The light introducing path includes a first light introducing path through which UV (ultraviolet rays) supplied from the UV generator 42 into a horizontal direction, the reflection mirror 423 which deviates UV passing through the first light introducing path into a direction of a central axis of the gimbal mechanism 45 that is a vertical direction, and a second light introducing path including the through hole 43A formed in the first and the second gimbal member 201 and 203 for introducing the UV reflected by the reflection mirror 42B toward a mold holding body 205. A portion of the first light introducing path on the side of the reflection mirror 42B is formed in the movable body 19 and a portion of the first light introducing path on the side of the UV generator 42 includes the optical fiber 42A. The reflection mirror 42B is provided on the side of the end of the first light introducing path (on the opposite side from the UV generator 42, on the upper side of the second light introducing path).

A servomotor 33 as one example of a drive unit that moves the movable body 19 is mounted and supported on the upper frame 5 as the support frame. An output shaft 35 of the servomotor 33 is connected to a hollow shaft 31 which is rotatably mounted on the upper frame 5 by a bearing 29. A ball screw nut 26 constituting a ball screw mechanism 25 is mounted on a lower end of the hollow shaft 31. A ball screw shaft 27 is vertically mounted and fixed to a central portion (center) in the longitudinal direction and the lateral direction of the movable body 19 is engaged with the ball screw nut 26 so that the movable body 19 is vertically moved at predetermined speed with predetermined torque. A reference symbol 33A represents a rotary encoder which detects a rotation position of the servomotor 33.

As shown in FIG. 3, the upper frame 5 is provided with a plurality of balance cylinders 50 as one example of a balancing unit at symmetric positions with respect to the center of the movable body 19. Piston rods 52 of the balance cylinders 50 are connected to the movable body 19 to offset the downward load of the movable body 19.

A ring-like upper cover 54 is mounted on a lower surface of the movable body 19 such as to surround the mold support plate 43 and the like. A ring-like lower cover 56 is mounted on the lower frame 7. A lower end of the lower cover 56 is movably engaged with a peripheral surface of a stationary stage 10, and an upper end of the lower cover 56 is formed on a lower end of the upper cover 54 such that the upper end of the lower cover 56 can be abutted against the lower end of the upper cover 54. The lower cover 56 surrounds a movable table 11 and the like. The lower cover 56 is vertically moved by a plurality of cylinders 58 as one example of a vertically moving actuator mounted on the lower frame 7. The lower cover 56 and the upper cover 54 form a molding chamber (decompression molding chamber) 60 around the mold support plate 43 and the movable table 11. The molding chamber 60 can open and close.

Next, the effect of the transfer apparatus will be explained. The lower cover 56 is lowered by the cylinder 58 as the vertically moving actuator to open the molding chamber 60. The mold 41 is mounted on the mold support plate 43. A mounting angle (a direction of the mold) in the horizontal rotation direction around the center of the mold 41 is finely adjusted by the turn table 47. The mounting angle of the mold 41 can be finely adjusted automatically not only when the mold is mounted but also at any time corresponding to a workpiece 13 set on the support stage 15 by known positioning means using a mark.

After the mold 41 is set as described above, the workpiece 13 having an upper surface formed with a molding layer made of ultraviolet cure resin is set on the support stage 15.

Next, the lower cover 56 is brought upward by the cylinders 58 to close the molding chamber 60, and a torque of the servomotor 33 is set to a relatively small value. In this state, the movable body 19 is lowered to bring the mold 41 close to the workpiece 13, and the mold 41 is pressed against the upper surface of the workpiece 13 with a relatively small pressing force.

At that time, the movable body 19 is lowered by the linear guide 21 and the slider 24 disposed on both left and right sides of the movable body 19 such that positional deviation (lateral deviation) in a direction perpendicular to the moving direction is suppressed to a small value, and the movable body 19 is pressed toward a predetermined position of the workpiece 13. At that time, a downward load of the movable body 19 caused by the gravity is offset by the balance cylinder 50. Therefore, the servomotor 33 can operate with smaller torque, and the movable body 19 is lowered while the torque and speed are more precisely controlled.

When the mold 41 is pressed against the workpiece 13, if the parallelism between abutment surfaces (contact surfaces) of them is deviated, since the mold 41 is tiltably supported by the gimbal mechanism 45, the entire surface of the mold 41 is pressed with an equal surface pressure along the upper surface of the workpiece 13. At that time, the gimbal mechanism 45 is tilted around the center of the mold surface by the spherical surface around the center of the mold surface of the mold 41 (lower surface in FIG. 2). Therefore, positional deviation in the lateral direction (the horizontal direction) is not generated.

The pressing force is detected by the load cell 46, it is fed back to the servomotor 33 and the force is maintained at a predetermined value. At that time also, since the load of the movable body 19 is offset by the balance cylinder 50 and the torque of the servomotor 33 is smaller value and thus, the torque is controlled more precisely.

If the pressing operation by the relatively small pressing force is completed, the pressure of the air bearing of the gimbal mechanism 45 is brought into a negative pressure, the attitude of the mold 41 is fixed to the immovable state and then, the torque of the servomotor 33 is increased. The mold 41 is strongly pressed against the molding layer made of the ultraviolet cure resin applied to the upper surface of the workpiece 13, and the fine concavo-convex pattern formed on the surface of the mold 41 is transferred to the molding layer of the workpiece 13.

Each of the tie bars 9 is very slightly extended by the strong pressing force of the mold 41 to displace the upper frame 5 upward. The displacement of the upper frame 5 is absorbed by the linear guide 21 and the slider 23, and an inconvenience that the upper portion of the body frame 3 is laterally warped in FIG. 1 is not generated. Thus, the positional deviation (lateral deviation) in the direction perpendicular to the moving direction of the mold 41 caused when the mold 41 is pressed is suppressed.

The upper frame 5 is supported by the linear guide 21 and the slider 23. Therefore, also when a difference is produced in extending degrees of the plurality of tie bars 9, the positional deviation (lateral deviation) of the upper frame 5 is suppressed to a small value, and the positional deviation (lateral deviation) of the mold 41 is suppressed to a small value.

The difference in the extending degree of the tie bars 9 is considerably small when the pressing force of the mold 41 is relatively small. Therefore, the guide unit of the upper frame 5 by the linear guide 21 and the slider 23 may be omitted.

After the pattern is transferred, the back surface of the mold 41 is irradiated with ultraviolet rays from the UV generator 42 through the light introducing path including the optical fiber 42A and the reflection mirror 42B for a predetermined time. Since the mold 41 is made of the clear quartz glass, the molding layer made of the ultraviolet cure resin applied to the upper surface of the workpiece 13 is irradiated with the ultraviolet rays emitted to the back surface of the mold 41, and this molding layer is cured.

After the molding layer is cured in this manner, the attitude of the mold 41 is fixed and in this state, the movable body 19 is moved upward by the servomotor 33 to separate the mold 41 from the workpiece 13. The lower cover 56 is then lowered by the cylinders 58 to open the molding chamber 60, the workpiece 13 is taken out and the series of a transfer operation is completed.

Figure 4:
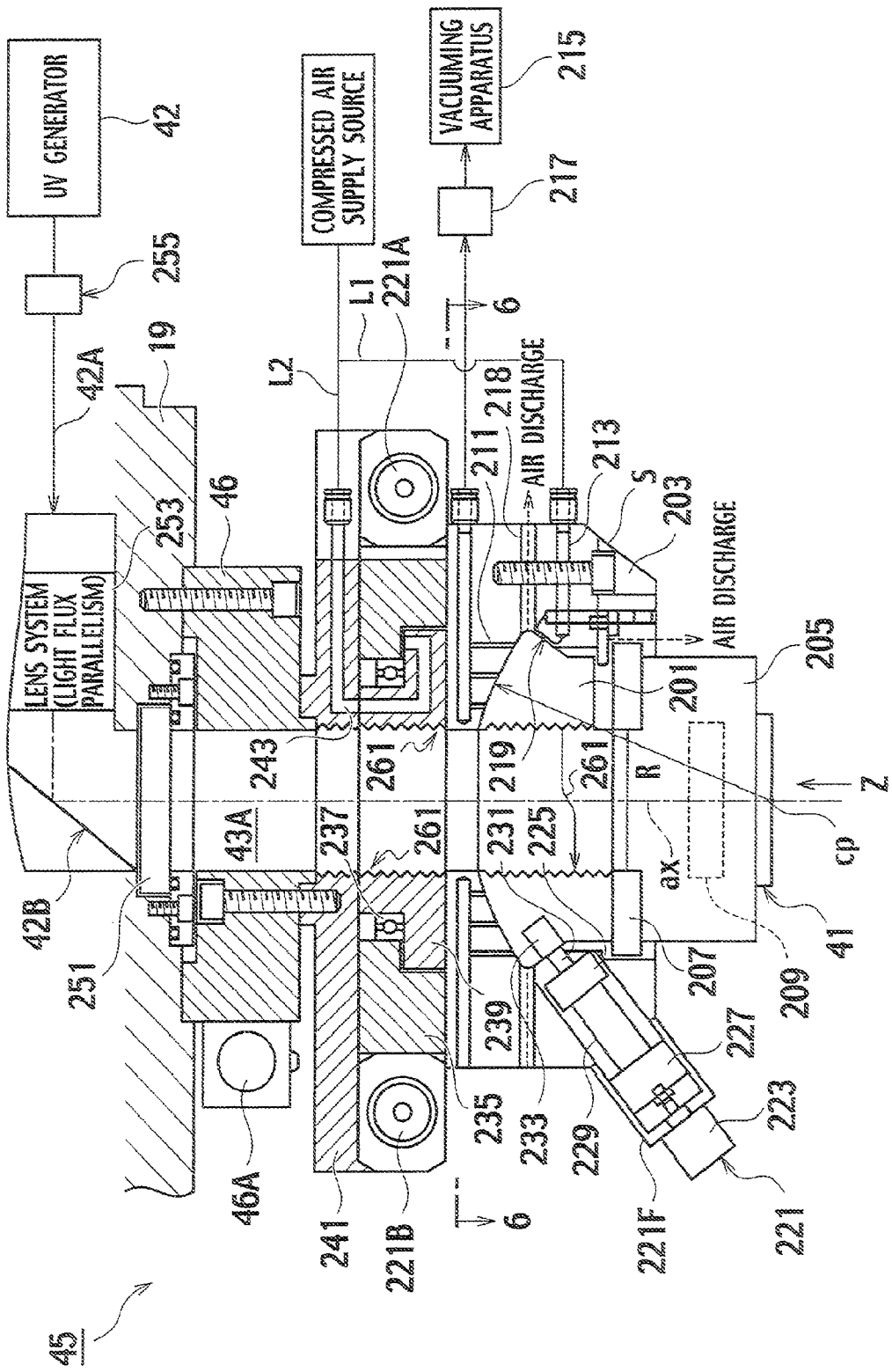
FIG. 4 is a vertical sectional view of a gimbal mechanism according to the present invention.
Figure 5:
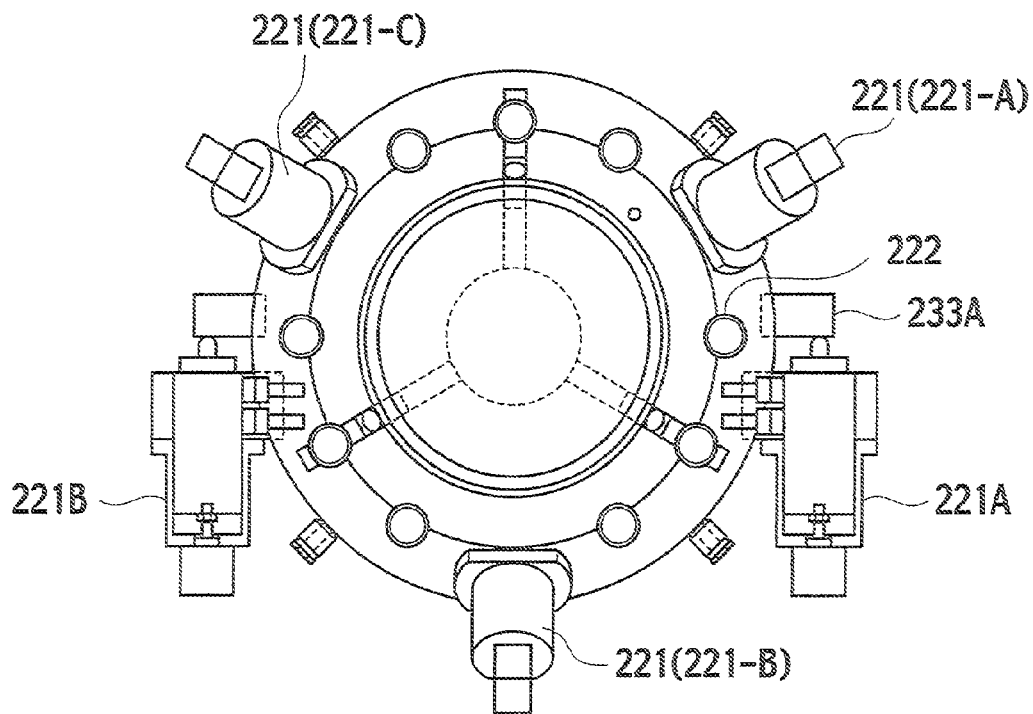
FIG. 5 is a diagram taken along an arrow Z in FIG. 4.
Figure 6:
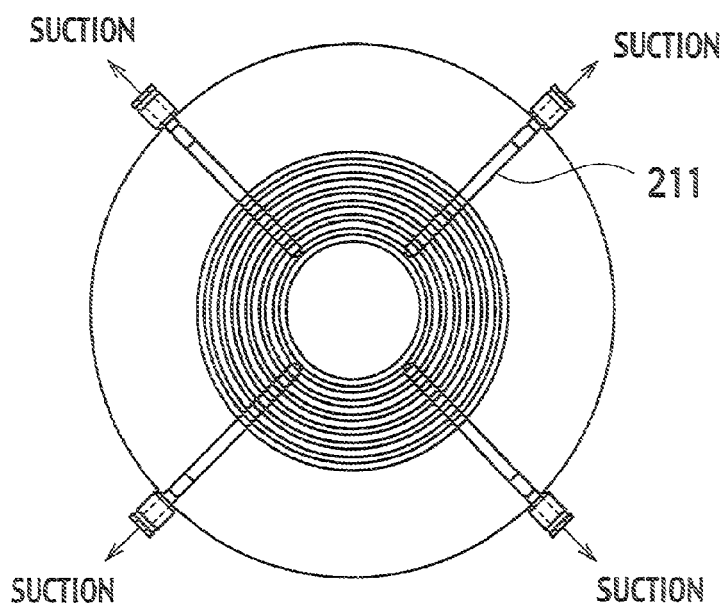
FIG. 6 is a diagram taken along a line 6-6 in FIG. 4.

FIGS. 4 to 6 show details of a portion of the gimbal mechanism 45.

FIG. 4 is a vertical sectional view of the gimbal mechanism 45 in the vertical direction. FIG. 5 is a diagram taken along the arrow Z in FIG. 4. FIG. 6 is a diagram taken along a line 6-6 in FIG. 4.

In FIG. 4, a lower gimbal member 201 and an upper gimbal member 203 are disposed such as to be opposed to each other. The lower gimbal member 201 and the upper gimbal member 203 are provided at their centers with through holes. The lower gimbal member 201 has a convex spherical surface portion and constitutes the gimbal mechanism 45. The upper gimbal member 203 has a concave spherical surface portion and also constitutes the gimbal mechanism 45. A mold holding body 205 is fixed to a lower surface of the lower gimbal member 201 through a heat insulator 207. The mold 41 is mounted on the lower surface of the mold holding body 205. A heater 209 is incorporated in the mold holding body 205. A cooling apparatus (not shown) can also be incorporated in the mold holding body 205 in addition to the heater 209.

The upper gimbal member 203 is formed with a suction conduit 211 which opens at the opposed surface, and is connected to a vacuuming apparatus (a negative pressure generating unit) 215 through a vacuum degree adjusting apparatus (a negative pressure adjusting unit) 217. FIG. 6 shows details of the suction conduit 211. The upper gimbal member 203 is provided with a floating conduit 213. Compressed air is injected toward the inclined surface 219 (floating surface) of a projection formed adjacent to the convex spherical surface portion of the lower gimbal member 201 from a compressed air supply source through a line L1.

More specifically, as shown in FIG. 4, the inclined surface 219 is formed into an inclined surface in which an upper side thereof with respect to an axis of the lower gimbal member 201 is inclined such as to separate therefrom or a tapered surface in which the upper portion of the inclined surface 219 is increased in diameter. An air injection hole of the floating conduit 213 is opened from the inclined surface or the tapered surface formed on the upper gimbal member 203 such as to be opposed to the inclined surface 219.

A reference symbol 218 represents an adjustment linear for adjusting a distance between opposed surfaces of the inclined surface 219 and the lower gimbal member 201.

A reference symbol 221 represents a piezo-hammer. Three frames 221F of the piezo-hammer 221 are disposed around the lower inclined surface S of the upper gimbal member 203 at equal distances from one another. As shown in the drawing, the piezo-hammer 221 is provided between the lower gimbal member 201 and the upper gimbal member 203. The piezo-hammer 221 includes a large inertial body 227 on a rod of the air cylinder 223, and a small inertial body 225 having a tip end on which a hammer 231 is mounted. A piezo-element 229 is connected between both the inertial bodies. Thus, if predetermined pulse-like voltage is applied to the piezo-element 229, the hammer 231 instantaneously strikes a imbedding block 233 which is disposed on the inclined surface of the lower gimbal member 201 and which is made of a hard material based on the difference in inertia of both the inertial bodies. With this configuration, if the inclined surface 219 of the lower gimbal member 201 is displaced in the axial direction by the hammer 231, the piezo-element 229 and both the inertial bodies are displaced by the air cylinder 223 correspondingly. With this configuration, even if the piezo-hammer 221 includes a relatively small number of laminated piezo-elements, the piezo-hammer 221 can move by a large stroke.

A turning member 235 is fixed to an upper surface of the upper gimbal member 203. An inner stationary member 239 is disposed on an inner peripheral side of the turning member 235 through a rotation bearing 237. A plate 241 is mounted on and fixed to an upper surface of the inner stationary member 239. The plate 241 and the inner stationary member 239 are formed with a conduit 243 through which compressed air is introduced through a line L2. The compressed air floats the turning member 235 under a static pressure as shown in the drawing.

As shown in FIG. 5, the turning member 235 can be turned in the clockwise direction and the counterclockwise direction by a pair of piezo-hammers 221A and 221B. Frames of the piezo-hammers 221A and 221B are fixed to the plate 241. A reference symbol 222 represents a mounting bolt.

It is also possible to use a piezo-actuator including laminated piezo-elements instead of the piezo-hammer 221, 221A, or 221B. In such a case, unlike the piezo-hammer, the tip end position of the piezo-actuator can be electrically preserved, and the attitude of the gimbal mechanism can be reproduced. That is, when a piezo-actuator (not shown) is disposed at the position instead of the piezo-hammer 221, it is possible to fix and hold the attitude of the lower gimbal member 201 by the three piezo-actuators themselves by controlling command electric signal to each the piezo-actuator. If a value of the command electric signal to each piezo-actuator when it is once fixed and held is stored in a memory, it is possible to reproduce the attitude of the lower gimbal member 201 any time by reading the stored value.

In the case of the piezo-actuator, it is possible to fix and hold the lower gimbal member 201 to a predetermined attitude at any time during molding operation (including mold-releasing operation), and it is possible to bring the first gimbal member 201 into its free state at a predetermined position in which the first gimbal member 201 approaches the table like a later-described piezo-hammer.

In FIG. 4, an upper surface of the plate 241 is provided with the load cell 46. A reference symbol 46A represents a signal taking out terminal. As explained with reference to FIG. 2, a bunch optical fibers 42A are introduced into the lens system (lens system provided on the movable body 19) 253 from the ultraviolet ray generator (UV generator) 42 through an ultraviolet rays intensity adjusting apparatus (UV intensity adjusting apparatus) and an ultraviolet rays irradiation time adjusting apparatus (UV irradiation time adjusting apparatus) 255, and the ultraviolet rays are formed into equal ultraviolet rays distribution, and the reflection mirror 42B is irradiated with the ultraviolet rays. The ultraviolet rays reflected from the mirror 42B go downward through a sealing glass material 251 and the through hole 43A concentrically formed with the central axis ax of the gimbal mechanism 45. When ultraviolet cure resin is used as the molding material (the workpiece), the mold holding body 205 and the mold 41 are made of a material such as quartz through which ultraviolet rays can pass of course. In such a case, the heater 209 is unnecessary.

A reference symbol 261 represents a screw portion (screw portion which is an example of a UV reflection suppressing unit) formed on an inner peripheral surface of the through hole of the lower gimbal member 201. The ultraviolet rays from above the through hole 43A spread in some degree because the ultraviolet rays are not completely parallel. Thus, if the downward ultraviolet rays pass through the mold 41 while reflected on the inner peripheral surface of the through hole of the lower gimbal member 201, the distribution of ultraviolet rays becomes uneven. To avoid such a case, downward reflection is prevented by a screw surface of the screw portion 261. In this case, it is preferable that the screw surface is coated with a material having low reflection coefficient. As the reflection suppressing unit, a material having UV absorbing function can be applied to an inner peripheral surface of the through hole 43A or the inner peripheral surface can be coated with the material.

The through hole 43A, the lens system 253, the UV generator 42 and the like are used when the resin which is the molding material is ultraviolet cure type, but if the ultraviolet cure type resin is not used, the through hole 43A, the lens system 253, the UV generator 42 and the like may be omitted:

The piezo-hammer 221 and the piezo-hammers 221A and 221B can optionally be provided. That is, when it is unnecessary to turn the gimbal mechanism 45, the turning member 235, the inner stationary member 239 and the piezo-hammers 221A and 221B can be omitted. If the attitude of the lower gimbal member 201 is not adjusted by the three piezo-hammers 221, the piezo-hammers 221 can be omitted.

An operation when the piezo-hammer 221, the turning member 235, the inner stationary member 239, and the piezo-hammers 221A and 221B are not mounted will be explained below.

In such a case, a workpiece is typically formed with fine concavo-convex pattern on a circumference such as CDs and DVDs, and it is preferable that the workpieces are not affected by a rotation direction position only if the center points thereof match with each other. The movable table 11 is positioned in X and Y directions such that a center of a substrate disposed on the movable table 11 matches with the central axis ax of the gimbal mechanism 45. When the movable body 19 is lowered, the suction of the gimbal mechanism is maximized, and the lower gimbal member 201 is absorbed by the upper gimbal member 203.

In this state, when the mold 91 is lowered to a predetermined position immediately before the mold 41 comes into contact with resin on the substrate, the lowering speed is reduced, the suction of vacuuming is weakened, the lower gimbal member 201 is brought into a free state, and a molding pressure is slowly applied. That is, the mold holding body 205 and the mold 91 mounted on and fixed to the lower gimbal member 201 downwardly presses the resin on the substrate disposed on the upper surface of the table together with the lower gimbal member 201, and are finally formed along the attitude which is in parallel to the substrate. In this case, the concavo and convex spherical surface center of the gimbal mechanism 45 matches with the lower end surface of the mold on the central axis ax of the gimbal mechanism and thus, deviation in the horizontal direction is not generated in the press molding process.

When the vacuuming suction is weakened and the lower gimbal member 201 is brought into the free state, it is preferable that a small amount of air is injected from an air injection outlet (not shown) which opens at the concave spherical surface portion of the upper gimbal member 203 toward the lower gimbal member 201. With this configuration, friction resistance between the upper gimbal member 203 and the lower gimbal member 201 is reduced, the lower gimbal member 201 can be moved more lightly and smoothly, it becomes easy to bring the transfer surface of the mold 41 in parallel to the substrate, and it is possible to more precisely press the resin on the substrate.

The plurality of suction conduits 211 shown in FIG. 6 are divided singularly or into a plurality of groups appropriately so that suction force is selectively applied to an appropriate number of annular grooves formed in the concave spherical surface portion of the upper gimbal member 203. When the suction force is produced with low vacuum degree, suction force is applied to odd-numbered annular grooves or a small number of annular grooves, and when suction force is produced with great vacuum degree, suction force is applied to a large number of or all of annular grooves.

That is, if the number of annular grooves to which suction force is applied is selected (the suction conduits 211 are divided singularly or into a plurality of groups, and the suction conduits 211 are brought into communication and out of communication with the vacuuming apparatus through valves) and with this, the suction force can be adjusted by vacuuming. If the grooves are divided into a larger number of groups, it is possible to adjust the vacuum degree more finely.

The mold 41 utilizes a signal of the rotary encoder 33A coupled to the servomotor 33 for detecting a predetermined position immediately before it comes into contact with the resin on the substrate, but it is also possible to provided a member which is electrically conducting or nonconducting is provided on the table 11 or the mold holding body 205 to detect the predetermined position.

When the piezo-hammer 221 is optionally mounted, the piezo-hammer 221 functions in the following-case. That is, before resin is supplied onto the substrate, the gimbal mechanism 45 is lowered in the adsorption state as described above, the mold 41 is pressed against the substrate and brought into contact with the substrate. When the contact state at that time is not completely parallel and is uneven, in order to correct the uneven state in a state where the suction force is weakened, appropriate voltage pulse is applied to the three piezo-hammers 221 and the uneven state is corrected. When more even state is established by previously finely adjusting, the gimbal mechanism is returned to the adsorption state and the molding operation is started. When a mold is released from resin after a workpiece is formed, if the piezo-hammer 221 is pulled upward while vibrating the piezo-hammer 221 at high frequency, the mold can smoothly be released from resin. In this case, since the amplitude of vibration is remarkably smaller than ultrasound, resin formed during the mold releasing operation is not damaged.

In this case, the number of hammer operations is one or more, and short time, i.e., it can be given at high frequency.

When the apparatus includes the pair of piezo-hammers 221A and 221B for turning the gimbal mechanism 45, the piezo-hammer functions in the following case. That is, when a substrate does not match on the table in the X and Y directions and has rotation components, and even if the center point coincides, a workpiece receives influence of the rotation direction position. In such a case, if the rotation direction position, i.e., angle is previously measured, voltage pulse corresponding to this value is given to the piezo-hammers 221A and 221B, and the gimbal mechanism 45 is turned and in this state, adsorption is performed.

For measuring the angle and the unevenness of parallelism, it is possible to provide an upper surface of a movable table, a substrate or a lower surface of a mold holding body with markings, the markings are physically (e.g., optically or electromagnetically) detected, and the rotation direction position or unevenness is calculated.

When a piezo-actuator is used, in an initial state for releasing the mold 41 from a molding material after the transfer operation is completed, the gimbal mechanism 41 can be allowed to swing at least once or more by the piezo-actuator.

Although the movable body 19 is guided by the linear guide 21 and vertically moved, if the relation between the upper surface of the workpiece 13 placed on the movable table 11 and the lower surface of the mold 41 is relatively slightly inclined, the mold 41 is easily inclined along the upper surface of the workpiece 13 through the gimbal mechanism 45, the lower surface (transfer surface) of the mold 41 and the upper surface (surface to which a pattern is to be transferred) of the workpiece 13 become parallel to each other and the transfer operation is performed.

When the attitude of the gimbal mechanism is controlled using the piezo-actuator, the following method is used.

Figure 7:
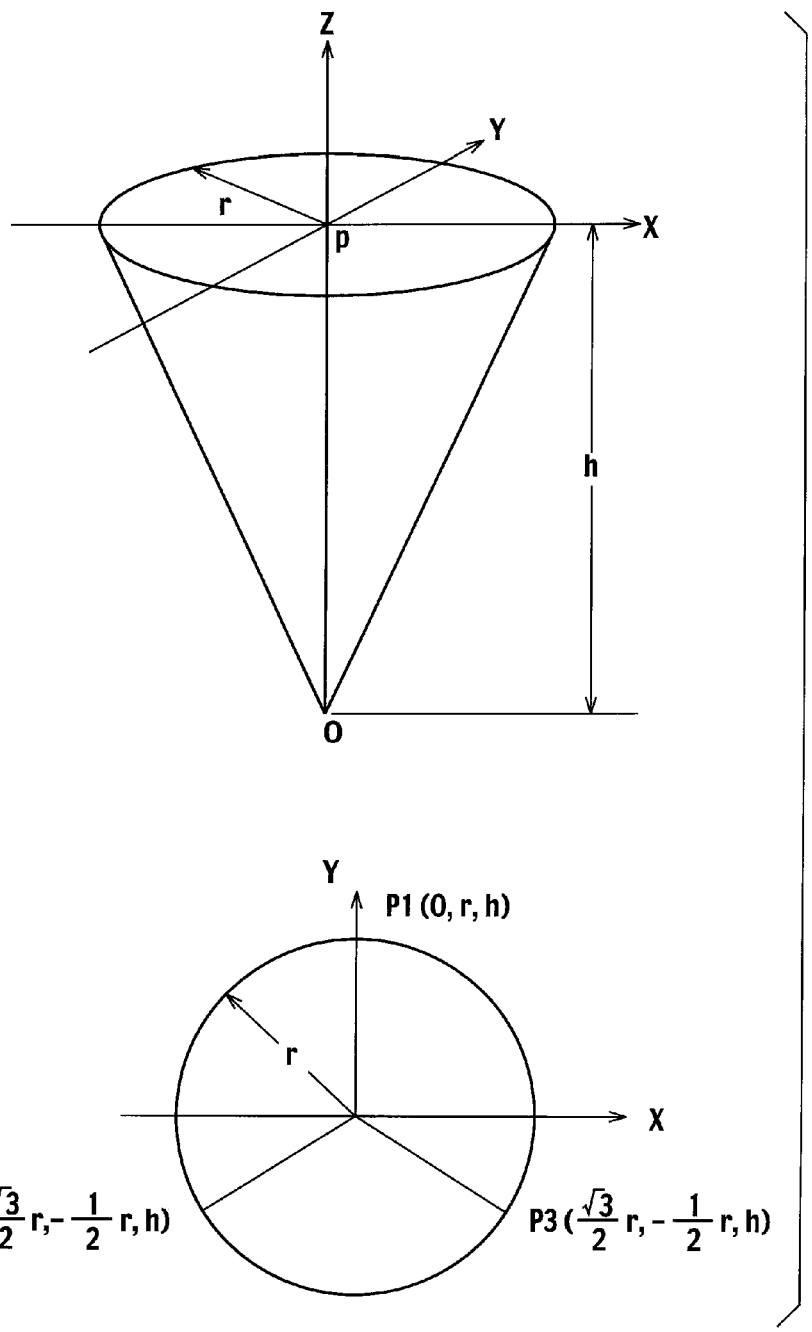
FIG. 7 is an explanatory diagram in which piezo-actuators are mounted on the gimbal mechanism.

FIG. 7 shows an embodiment in which the piezo-actuators are mounted on the gimbal mechanism.

Three piezo-actuators are disposed at equal distances from each other while deviating phases from one another by 120°, and the actuators are mounted such that the direction of displacement of actuators and a side surface of the gimbal mechanism are perpendicular to each other. The mounting positions of the three actuators are defined as P1, P2, and P3, respectively. When the displacement amounts of the piezo-actuators are zero and in their balanced state, the mold plate is in the horizontal state.

As shown in FIG. 7, when X-Y-Z coordinate systems having an original point of rotation center O (center point CP of a lower surface of a mold plate 91 in FIG. 4) of the gimbal mechanism is used, coordinate values of contact points between the piezo-actuators and the gimbal mechanism at each of the P1, P2, and P3 in the balance state are as follows.

$$P1(0, r, h)$$
$$P2\left(-\frac{\sqrt{3}}{2}r, -\frac{1}{2}r, h\right)$$
$$P3\left(\frac{\sqrt{3}}{2}r, -\frac{1}{2}r, h\right)$$

In this equation, r represents a pitch circle radius of a circle connecting P1, P2, and P3, and h represents height from the mold plate lower surface to the horizontal surface formed by the P1, P2, and P3.

In order to finely adjust the inclination of the mold plate lower surface by changing the attitude of the gimbal, it is necessary to apply voltage to the piezo-actuators to displace the same.

Since there is geometric constraint in the relation with respect to the gimbal mechanism, it is necessary to give mutually related displacement command to the actuators.

Figure 8:
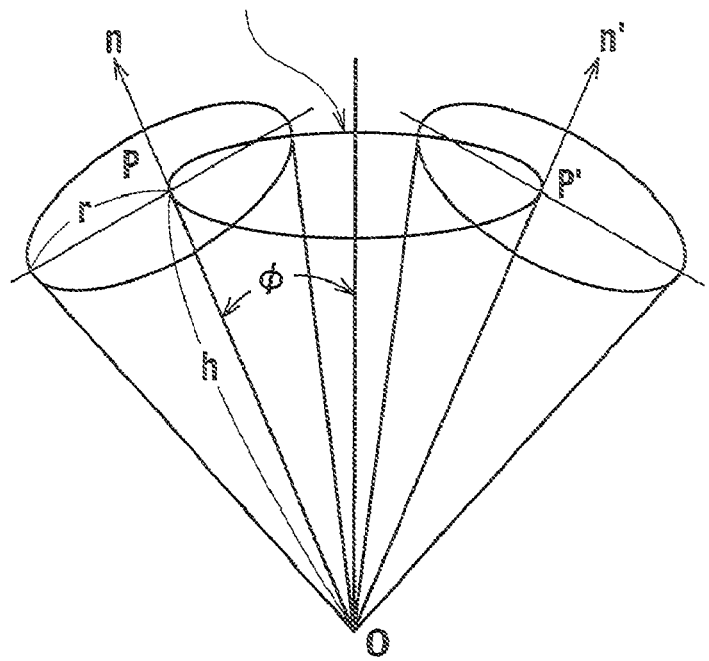
FIG. 8 is an explanatory diagram of attitude control of the gimbal mechanism.
Figure 8:
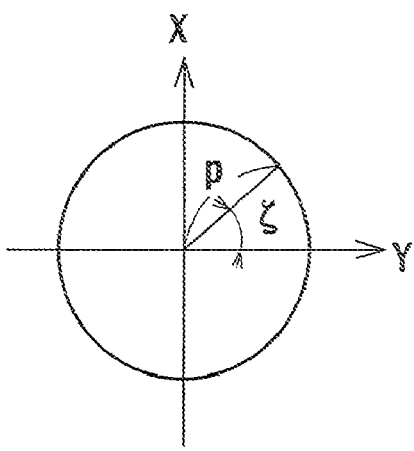

As shown in FIG. 8, an inclination angle of a unit normal vector of a lower surface of a mold plate with respect to the vertical axis (Z axis) is defined as $\phi$, projection of the normal to the X-Y plane is defined as $\rho$, and angle of deviation in the X-Y plane of this projection is defined as $\zeta$, $\rho = \sin \phi$. When the mold plate is controlled to a desired attitude, if the $\rho$ and $\zeta$ are designated to instruct the inclination, and if displacement in which phases are deviated through 120° is instructed to the piezo-actuators, desired attitude is obtained. $\Delta 1$, $\Delta 2$, and $\Delta 3$ represent displacement amounts from balanced states of the piezo-actuators.

$$\Delta 1 = \rho \sqrt{r^2 + h^2} \sin \zeta$$
$$\Delta 2 = \rho \sqrt{r^2 + h^2} \sin\left(\zeta + \frac{2}{3}\pi\right)$$
$$\Delta 3 = \rho \sqrt{r^2 + h^2} \sin\left(\zeta - \frac{2}{3}\pi\right)$$

If voltages V1, V2, and V3 which are proportional to these values are applied to the piezo-hammers 221-A, 221-B, and 221-C as finely adjusting actuators, necessary fine rotation (minute vibration) can be applied to the mold. The calculation is performed by a control apparatus.

The present invention is not limited only to the above-described embodiment, and the invention can also be carried out in other modes by appropriate modifications thereof. For example:

(A) The molding layer can be any resin in addition to the ultraviolet cure resin and thermoplastic resin. Any one of a softening unit and a hardening unit or both can be selected corresponding to the material of the molding layer;

(B) The mold 41 can be set on the side of the lower frame 7 and the workpiece 13 can be mounted on the side of the movable body 19. At that time, anyone of a softening unit and a hardening unit or both of the molding layer is also changed appropriately;

(C) When the workpiece 13 is not moved to either one of the X direction and the Y direction, the gimbal mechanism 45 can be disposed on a side where the workpiece 13 is set. In this case, and also when the mold 41 is set on the side of the lower frame 7, the gimbal mechanism 45 can be mounted on the side of the lower frame 7;

(D) It is also possible to vertically or laterally reverse the configuration shown in FIGS. 1 and 2. That is, although the configuration of the vertical mold is shown in the above explanation, it is also possible to vertically reverse the vertical mold or a lateral mold can be employed, and various configurations can be employed;

(E) In the embodiment, the table is disposed at a lower portion, and the gimbal mechanism and the movable body are disposed at upper portion, however, they can be disposed in the reversed relation. When they are vertically reversely disposed, since the downward force is always applied to the first gimbal member due to gravity, the suction force with respect to the second gimbal member located below the first gimbal member can be reduced as compared with the configuration shown in FIG. 4, or it is possible to eliminate the need for separately generating the suction force utilizing the gravity itself. At that time, it is only necessary to control the floating force applied to the first gimbal member caused by compressed air; and (F) In the embodiment, in order to suck the lower gimbal member 201 (corresponding to the first gimbal member in the invention) toward the upper gimbal member 203 (corresponding to the second gimbal member of the invention), vacuum, i.e., decompression is utilized. In this case, if the molding chamber 60 disposed at the lower portion is vacuumed, the decompression is offset and thus, suction effect cannot be expected. To solve this problem, it is also possible to generate suction force greater than that generated by the decompression in the molding chamber 60 between both the gimbal members 201 and 203 using electromagnet or permanent magnet for example.

What is claimed is:

1. A transfer method for performing fine transfer operation using a transfer apparatus having a gimbal mechanism, comprising: a table on which a molding material is placed, a mold holding body that fixes and holds a transfer mold disposed such as to be opposed to the table surface, a first gimbal member which holds the mold holding body on one surface of the first gimbal member and which forms a convex spherical surface portion on the other surface of the first gimbal member, a second gimbal member formed with a concave spherical surface portion which is opposed to and in contact with a convex spherical surface portion of the first gimbal member, a movable body that holds the second gimbal member and which can advance and retreat in a vertical direction with respect to the table surface, a movable body drive unit including a servomotor for advancing and retreating the movable body in the vertical direction, and an attitude adjusting/holding unit that adjusts and holds an attitude of the first gimbal member, wherein the attitude adjusting/holding unit includes at least three piezo-hammers, each of the piezo-hammers including a piezo-element, two inertial bodies having different inertia amounts, and a fluid pressure cylinder, and the piezo-hammers being disposed on a circumference between the first and the second gimbal members at equal distances from one another, the transfer method comprising:
holding the attitude of the first gimbal member of the gimbal mechanism during a lowering motion of the movable body and until the mold is lowered to a predetermined lowering position immediately before the mold comes into contact with a substrate; and when the movable body reaches the predetermined lowering position, bringing the attitude of the first gimbal member into a free state, and reducing a speed of the first gimbal member, and performing a molding operation with respect to a molding material.

2. The transfer method according to claim 1, wherein the attitude adjusting/holding unit sucks the first gimbal member toward the second gimbal member under vacuum, the attitude holding of the first gimbal member is performed by increasing the intensity of vacuum suction to establish an adsorption state, and the free state of the attitude is established by reducing the vacuum suction.

3. The transfer method according to claim 1, wherein in an initial stage for releasing the mold from the molding substrate after the transfer operation is completed, generating a hammer motion with the piezo-hammer at least once.

* * * * *